US011171026B2

(12) United States Patent
Lin et al.

(10) Patent No.: US 11,171,026 B2
(45) Date of Patent: Nov. 9, 2021

(54) SYSTEMS, DEVICES, AND METHODS FOR USING A REAL TIME ENVIRONMENT SENSOR IN A FOUP

(71) Applicant: Taiwan Semiconductor Manufacturing Co., Ltd., Hsinchu (TW)

(72) Inventors: Po Shun Lin, Taichung (TW); Zhi Long Huang, Hsinchu (TW); Kung Chieh Cheng, Hsinchu (TW)

(73) Assignee: TAIWAN SEMICONDUCTOR MANUFACTURING CO., LTD., Hsinchu (TW)

( * ) Notice: Subject to any disclaimer, the term of this patent is extended or adjusted under 35 U.S.C. 154(b) by 0 days.

(21) Appl. No.: 17/013,243

(22) Filed: Sep. 4, 2020

(65) Prior Publication Data
US 2020/0402826 A1    Dec. 24, 2020

Related U.S. Application Data

(63) Continuation of application No. 15/906,987, filed on Feb. 27, 2018, now Pat. No. 10,790,177.
(Continued)

(51) Int. Cl.
*H01L 21/673*      (2006.01)
*H01L 21/67*       (2006.01)
(Continued)

(52) U.S. Cl.
CPC .......... *H01L 21/67393* (2013.01); *G01F 1/74* (2013.01); *G01N 25/56* (2013.01);
(Continued)

(58) Field of Classification Search
CPC ........ G01N 25/56; G01N 25/60; G01N 25/68; G05D 22/02; G01F 1/74
(Continued)

(56) References Cited

U.S. PATENT DOCUMENTS 4,745,088 A * 5/1988 Inoue ................. C23C 16/4584
                                              117/98
5,879,458 A * 3/1999 Roberson, Jr. .... H01L 21/67393
                                              118/715
(Continued)

FOREIGN PATENT DOCUMENTS

CM   1503749 A    6/2004
CN   1503749 A    6/2004
(Continued)

*Primary Examiner* — Clayton E. LaBalle
*Assistant Examiner* — Kevin C Butler
(74) *Attorney, Agent, or Firm* — Haynes and Boone, LLP (57) ABSTRACT

The present disclosure provides systems and methods for monitoring an environment of a front opening universal pod (FOUP). The systems and methods may include an environmental sensor disposed within the FOUP and configured to measure one or more environmental parameters of an interior environment of the FOUP; and a wireless transmitter disposed within the FOUP and in communication with the environmental sensor, wherein the wireless transmitter is configured to wirelessly transmit the one or more environmental parameters from the environmental sensor to a controller disposed outside of the FOUP to decide whether the one or more environmental parameters are within threshold limits and receive a message according to a decision of whether the one or more environmental parameters are within the threshold limits from the controller.

20 Claims, 5 Drawing Sheets

Related U.S. Application Data (60) Provisional application No. 62/585,762, filed on Nov. 14, 2017.

(51) Int. Cl.
| | | |
|---|---|---|
| *G01N 25/68* | (2006.01) | |
| *G05D 22/02* | (2006.01) | |
| *G01F 1/74* | (2006.01) | |
| *G01N 25/56* | (2006.01) | |
| *G01N 25/60* | (2006.01) | |

(52) U.S. Cl.
CPC .............. *G01N 25/60* (2013.01); *G01N 25/68* (2013.01); *G05D 22/02* (2013.01); *H01L 21/67253* (2013.01); *H01L 21/67389* (2013.01)

(58) Field of Classification Search
USPC ...................................................... 73/29.01
See application file for complete search history.

(56) References Cited

U.S. PATENT DOCUMENTS

| | | | | | |
|---|---|---|---|---|---|
| 5,986,233 | A | * | 11/1999 | Antieau | B23K 1/0056 219/121.12 |
| 5,988,233 | A | * | 11/1999 | Fosnight | H01L 21/67393 141/63 |
| 6,364,922 | B1 | * | 4/2002 | Tanaka | H01L 21/67393 206/710 |
| 6,632,068 | B2 | * | 10/2003 | Zinger | H01L 21/67769 414/800 |
| 6,899,145 | B2 | * | 5/2005 | Aggarwal | H01L 21/67393 141/11 |
| 6,942,738 | B1 | * | 9/2005 | Nelson | H01L 21/67754 134/33 |
| 2001/0009641 | A1 | * | 7/2001 | Haraguchi | H01L 21/67265 414/416.03 |
| 2002/0150449 | A1 | * | 10/2002 | Nelson | H01L 21/67778 414/217.1 |
| 2003/0123958 | A1 | * | 7/2003 | Sieradzki | H01L 21/67745 414/217 |
| 2003/0209404 | A1 | * | 11/2003 | Davis | H01L 21/68707 198/345.3 |
| 2004/0075822 | A1 | * | 4/2004 | Hattori | G03F 7/7075 355/72 |
| 2004/0267501 | A1 | * | 12/2004 | Freed | H02J 7/025 702/184 |
| 2005/0115866 | A1 | * | 6/2005 | Burns | H01L 21/67369 206/710 |
| 2005/0177272 | A1 | * | 8/2005 | Buchmann | G07C 9/00309 700/225 |
| 2006/0118138 | A1 | * | 6/2006 | Spiegelman | H01L 21/02046 134/26 |
| 2006/0207916 | A1 | * | 9/2006 | Mimura | H01L 21/67379 206/710 |
| 2007/0009345 | A1 | * | 1/2007 | Hall | B65G 47/34 414/222.01 |
| 2008/0023442 | A1 | * | 1/2008 | Ito | H01L 21/67393 216/58 |
| 2008/0053794 | A1 | * | 3/2008 | Brain | B65G 37/005 198/626.1 |
| 2008/0112784 | A1 | * | 5/2008 | Rogers | H01L 21/67775 414/411 |
| 2008/0152466 | A1 | * | 6/2008 | Bonora | B65G 1/0407 414/222.07 |
| 2008/0156679 | A1 | * | 7/2008 | Bonora | B65D 85/30 206/320 |
| 2009/0016862 | A1 | * | 1/2009 | Gould | H01L 21/67363 414/225.01 |
| 2009/0114507 | A1 | * | 5/2009 | Kitazumi | B65G 47/901 198/370.09 |
| 2009/0180848 | A1 | * | 7/2009 | Clark | H01L 21/67393 414/222.01 |
| 2009/0245981 | A1 | * | 10/2009 | Miyajima | H01L 21/67772 414/222.02 |
| 2010/0051501 | A1 | * | 3/2010 | Corbin, Jr. | H01L 21/67393 206/710 |
| 2010/0059408 | A1 | * | 3/2010 | Igarashi | H01L 21/67772 206/710 |
| 2010/0117377 | A1 | * | 5/2010 | Okabe | E05B 17/0029 292/159 |
| 2010/0133270 | A1 | * | 6/2010 | Okabe | H01L 21/67772 220/212 |
| 2010/0135755 | A1 | * | 6/2010 | Sasaki | H01L 21/67772 414/411 |
| 2010/0182586 | A1 | * | 7/2010 | Ogura | H01L 21/67772 355/77 |
| 2010/0184296 | A1 | * | 7/2010 | Nambu | H01L 21/67389 438/706 |
| 2010/0192844 | A1 | * | 8/2010 | Kim | H01L 21/67184 118/69 |
| 2010/0195066 | A1 | * | 8/2010 | Kim | G03F 7/7075 355/27 |
| 2011/0220545 | A1 | * | 9/2011 | Ra | H01L 21/67389 206/711 |
| 2011/0290185 | A1 | * | 12/2011 | Ihara | H01L 21/67745 118/724 |
| 2012/0083918 | A1 | * | 4/2012 | Yamazaki | H01L 21/67389 700/112 |
| 2012/0235793 | A1 | * | 9/2012 | Yi | H01L 21/67294 340/10.1 |
| 2013/0174640 | A1 | * | 7/2013 | Oh | H01L 21/67389 73/23.2 |
| 2013/0216336 | A1 | * | 8/2013 | Lee | H01L 21/67733 414/225.01 |
| 2014/0121831 | A1 | * | 5/2014 | Kim | B25J 11/0075 700/245 |
| 2014/0200702 | A1 | * | 7/2014 | Liu | G01N 29/2481 700/112 |
| 2015/0116674 | A1 | * | 4/2015 | Hwang | H01L 21/67155 355/27 |
| 2016/0329225 | A1 | * | 11/2016 | Bachlechner | H01L 21/67393 |
| 2016/0370797 | A1 | * | 12/2016 | Azarya | G05B 19/4184 |
| 2017/0315107 | A1 | * | 11/2017 | Chou | G01N 33/0044 |
| 2017/0372924 | A1 | * | 12/2017 | Bello | H01L 21/67353 |
| 2018/0048169 | A1 | * | 2/2018 | Bello | H01L 21/6773 |
| 2018/0358249 | A1 | * | 12/2018 | Nagaike | H01L 21/67288 |
| 2019/0131152 | A1 | * | 5/2019 | Bae | H01L 21/67253 |
| 2019/0148196 | A1 | * | 5/2019 | Lin | H01L 21/67393 73/29.01 |
| 2019/0229000 | A1 | * | 7/2019 | Kuan | H01L 21/67389 |

FOREIGN PATENT DOCUMENTS

| | | | | |
|---|---|---|---|---|
| CN | 101600637 A | | 12/2009 | |
| CN | 105845600 A | | 8/2016 | |
| JP | 2003303869 | * | 10/2003 | ............ B65G 49/07 |
| KR | 100885010 B1 | | 2/2009 | |
| KR | 20110103830 A | | 9/2011 | |
| TW | 200421419 A | | 10/2004 | |
| TW | 201038456 | * | 11/2010 | ............ B65G 43/08 |
| TW | 201216021 | | 4/2012 | |
| TW | M500354 | * | 5/2015 | ............ H01L 21/66 |

* cited by examiner

SYSTEMS, DEVICES, AND METHODS FOR USING A REAL TIME ENVIRONMENT SENSOR IN A FOUP

PRIORITY CLAIM

The present application is a continuation application of the U.S. application Ser. No. 15/906,987, filed Feb. 27, 2018, which claims the benefit of U.S. Ser. No. 62/585,762 filed Nov. 14, 2017, both of which are hereby incorporated by references in their entireties.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component or line that can be created using a fabrication process) has decreased. This scaling down process generally provides benefits by increasing production efficiency and lowering associated costs. Such scaling down has also increased the complexity of processing and manufacturing ICs and, for these advances to be realized, similar developments in IC processing and manufacturing are needed.

As one example, semiconductor lithography processes may include processing semiconductors wafers using lithographic templates (e.g., photomasks or reticles) to optically transfer patterns onto a substrate. Such a process may be accomplished, for example, by projection of a radiation source, through an intervening photomask or reticle, onto a photosensitive material (e.g., photoresist) coating on the wafer. The minimum feature size that may be patterned by way of such a lithography process is limited by the wavelength of the projected radiation source. In view of this, precise lithographic processes have been introduced, including radiation sources such as extreme ultraviolet (EUV) radiation sources. However, these precise processes may cause the wafers to be very sensitive to contamination issues. For example, particle contamination introduced onto a wafer can result in significant degradation of lithographically transferred patterns. The particle contamination may occur during handling and transportation of wafers. Furthermore, the wafers may be sensitive to changes in temperature, humidity, and other environmental factor.

To avoid this contamination, wafers may be placed in a Front Opening Unified Pod (FOUP) for transportation and holding between processes. FOUPs generally include a specialized enclosure designed to provide a controlled environment for the wafers. However, existing transportation and handling processes do not provide for measurement of the environment of the FOUPs during or between processing stages ("inline") and instead only measure environmental factors when FOUPs are taken out of processing ("offline"). This may allow unaddressed environmental problems, which in turn, may damage wafers. Thus, existing environmental systems for FOUPs have not proved entirely satisfactory in all respects.

BRIEF DESCRIPTION OF THE DRAWINGS

The present disclosure is best understood from the following detailed description when read with the accompanying figures. It is emphasized that, in accordance with the standard practice in the industry, various features are not drawn to scale. The dimensions of the various features may be arbitrarily increased or reduced for clarity of discussion.

DETAILED DESCRIPTION

The present disclosure relates to monitoring the environment of a FOUP. While the present disclosure is described in terms of monitoring a FOUP, it will be appreciated that the any device used for transporting or handling sensitive devices can benefit from the present invention.

It is understood that the following disclosure provides many different embodiments or examples for implementing different features of the invention. Specific examples of components and arrangements are described below to simplify the present disclosure. These are merely examples and are not intended to be limiting. Some items are shown in a simplified form and inherently include components that are well known in the art. In addition, the present disclosure may repeat reference numerals and/or letters in the various examples. This repetition is for the purpose of simplicity and clarity and does not in itself dictate a relationship between the various embodiments and/or configurations discussed.

Figure 1:
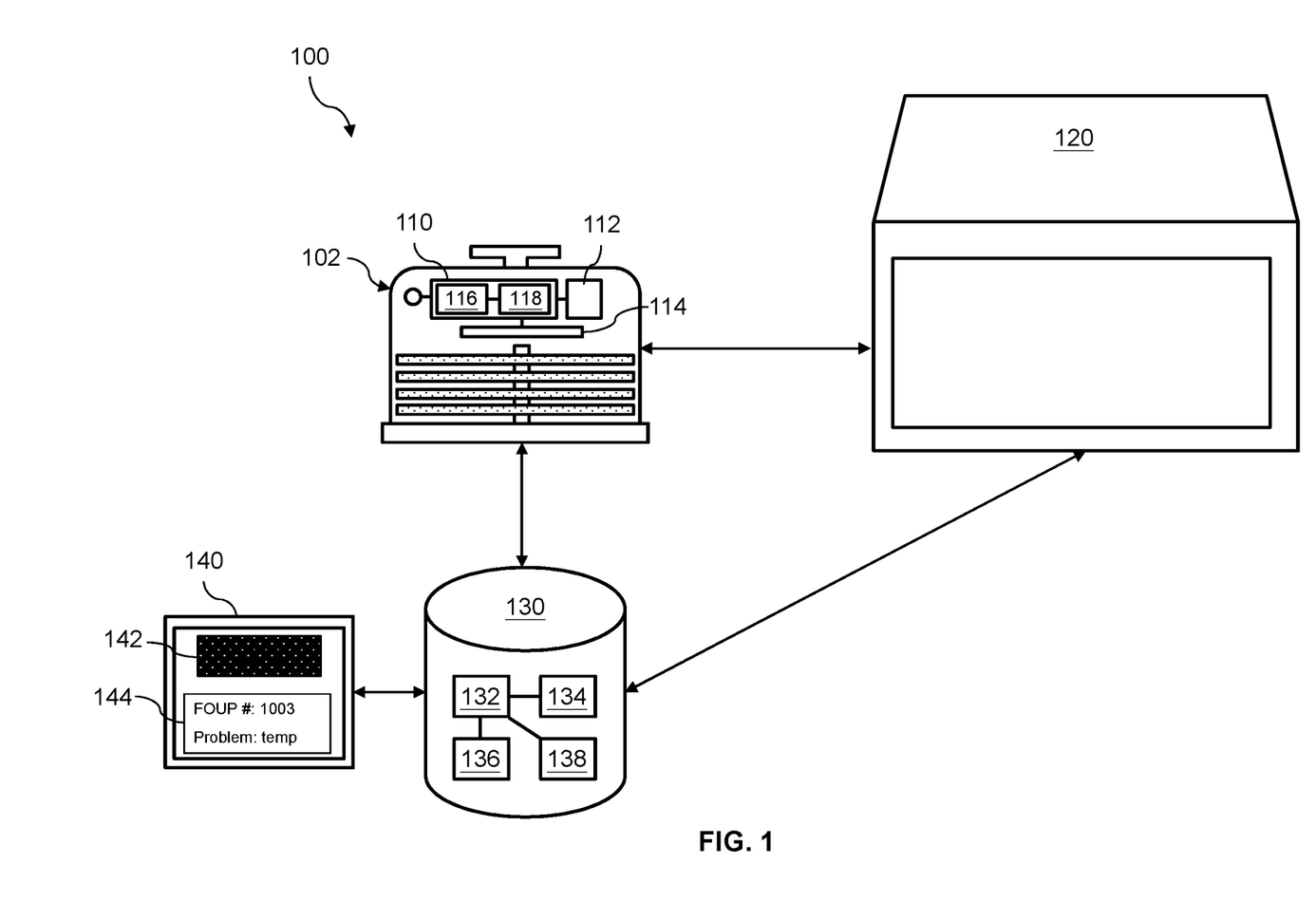
FIG. 1 is a diagram of a system for monitoring a FOUP in accordance with aspects of the present disclosure.
Figure 3:
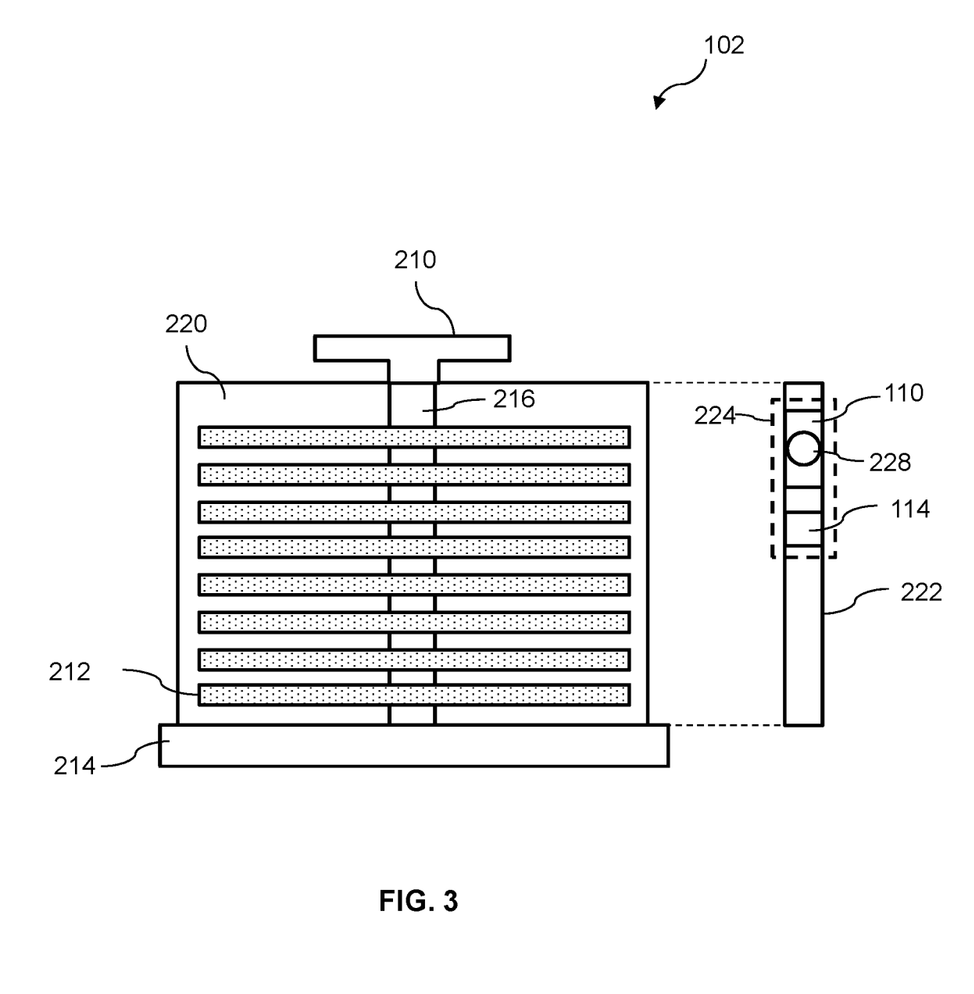
FIG. 3 is another diagram of a FOUP with one or more environmental sensors in accordance with aspects of the present disclosure.

Referring to FIG. 1, a diagram of a monitoring system 100 is shown. The monitoring system 100 may include a FOUP 102, a processing stage 120, a controller 130, and a display device 140. In some embodiments, the FOUP 102 may include one or more environmental sensors 110 and a transmitter 114. The one or more environmental sensors 110 may be disposed within the FOUP 102 (such as on a door 222 of the FOUP 102 as shown in FIG. 3). In some embodiments, the one or more environmental sensors 110 are configured to measure environmental parameters of the interior environment of the FOUP. In particular, the one or more environmental sensor 110 may provide real time measurements of environmental parameters of the FOUP. These measurements may be stored in one or more memory devices such as memory 118, which may be disposed in the FOUP 102. The transmitter 114 may be a wireless transmitter, and may be configured to transmit the measured environmental parameters to the controller 130.

In some embodiments, real time monitoring of the FOUP 102 may prevent harm to wafers stored within the FOUP 102. In some cases, wafers are stored within a FOUP 102 for more than twice as much time as they are within processing stages. Existing systems may not be able to identify environmental problems between stages, which may increase the risk of damage to wafers. Therefore, the quick identification and remedy of environmental problems as provided by the embodiments presented herein can avoid serious damage to wafers.

In other embodiments, the one or more environmental sensors 110 are configured to measure environmental parameters of the FOUP 102 at particular times. For example, the one or more environmental sensors 110 may be configured to measure environmental parameters of the FOUP 102 before and after a particular process stage 120. This may help to reduce the amount of power consumed by the environmental sensors 110.

The controller 130 may include a processor 132, a memory 134, a transmitter 136, and a receiver 138. In some embodiments, the controller 130 is configured to collect and analyze measured environmental parameters from the environmental sensor 110 and determine if the environmental parameters are within acceptable limits. The controller 130 may also be configured to send instructions to the FOUP 102, the process stage 120, or other devices if the measured environmental parameters are not within acceptable limits. For example, if the one or more environmental sensors 110 sends measurements to the controller 130 that show that environmental parameters are above safe operating limits, the controller 130 may send instructions to remove the FOUP 102 from processing and remedy the problem.

The processor 132 of the controller 130 may include any one or more of a microprocessor, a controller, a digital signal processor (DSP), an application specific integrated circuit (ASIC), a field-programmable gate array (FPGA), or equivalent discrete or integrated logic circuitry. In some embodiments, the controller 130 is a computer system. The processor 132 may be connected to the memory 134, transmitter 136, and receiver 138. In some embodiments, the processor 132 is connected to a display device 140 (such as a monitor or other type of screen) for viewing environmental measurements, alerts, and instructions. The display device 140 may be used to display the status of the FOUP, environmental alerts, or other information relevant to the FOUP.

In some embodiments, the controller 130 is configured to transmit an alert to one or more operators identifying a FOUP 102 with an environmental problem as well as the type of environmental problem that has been identified (i.e., "particles" for particle contamination). These alerts may be displayed on the display device 140. The display device 140 may be a computer monitor or other type of screen that may be viewed by an operator. The display device 140 may be configured to display a visual alert 142. For example, in the example of FIG. 1, the display device 140 shows a simple "ALERT" message. The color of the visual alert 142 may include colors, shapes, icons, blinking patterns, etc., to indicate that a problem exists with a FOUP 102. In some embodiments, the colors of the visual alert 142 may correspond with problems that are identified. For example, the visual alert 142 may display a red alert if the temperature is found to be above acceptable limits, a yellow color if particulate levels are found to be higher than normal, etc. In other embodiments, a single color (such as red) is used for all visual alerts.

Other messages 144 may also be displayed on the display device 140. These other messages 144 may include a particular number or identification data of a FOUP 102, as well as the problem that has been identified. For example, in the example of FIG. 1, the temperature of the FOUP 102 was measured by the one or more environmental sensors 110 and determined to be above acceptable levels by the controller 130. Thus, the message 144 lists "temp" as the problem. Other problems that may be identified by the other messages 144 include humidity that is higher or lower than normal, temperature that is higher or lower than normal, vibration levels that are higher than normal, incident radiation levels that are higher than normal, particle amounts that are higher than normal, and problems with the chemical composition within the FOUP 102 (such as amounts of other gases besides nitrogen being measured). The display of the visual alert 142 and other messages 144 may allow an operator to quickly identify an environmental problem and the particular FOUP 102 with the problem. This may help to remedy the problem quickly and minimize harm to the wafers within the FOUP 102.

The controller 130 may also transmit instructions to the FOUP 102 itself to indicate an environmental problem. In one embodiment, the FOUP 102 includes an indicator 228 such as a light or screen that is configured to display a certain color or blinking pattern if environmental problems are found. For example, if the one or more environmental sensors 110 detect humidity levels that are higher than acceptable levels, the FOUP 102 may display a blinking red light. The indicator 228 may be placed on the enclosure 220 of the FOUP 102 or the door 222 of the FOUP 102 (as shown in FIG. 3). The type, shape, and display of the indicator may vary. For example, in one embodiment, the indicator 228 is a small LED light that is configured to display a red or green light depending on the status of the FOUP 102. In another embodiment, the indicator 228 is a screen disposed on the exterior of the FOUP 102 and configured to display real time measurements of the environmental parameters as measured by the one or more environmental sensors 110. The use of the display device 140 as well as the indicator 228 may help operators to quickly identify and remedy problems with the FOUP 102 and thus avoid damage to wafers.

The memory 134 of the controller 130 may be a semiconductor memory such as, for example, read-only memory, a random access memory, a FRAM, or a NAND flash memory. The memory 134 may interface with the processor 132 and associated processors such that the processor 132 may write to and read from the memory 134. In some embodiments, the memory 134 may be configured to store the environmental measurements from the one or more environmental sensors 110. The memory 134 may also be configured to store previous readings from the environmental sensors 110 as well as threshold values for each environmental parameter. In this case, the controller 130 may compare the environmental measurements to the thresholds to determine if the environment within the FOUP 102 is within safe operating conditions. If this is not the case, the controller 130 may issue an alert to an operator and/or a process stage 120 so that the environmental problem can be corrected.

In some embodiments, the memory 134 of the controller 130 is configured to store the environmental parameters measured by the one or more environmental sensors 110. For example, the environmental parameters for a particular FOUP 102 may be stored during an entire operation, including before and after all processing stages. This may allow an operator to determine when environmental problems arise during processing stages, such as identifying areas within a fabrication area where temperature or humidity is higher than normal. In one embodiment, the memory 134 may be configured to store environmental parameters from a number of FOUPs. These parameters may be compared to determine trends in FOUP environments. The storing and comparison of environmental parameters may also help to identify problematic FOUPs to avoid continuing damage to wafers.

The receiver 138 of the controller 130 may be configured to receive transmissions from the transmitter 114 of the FOUP 102. The memory 134 of the controller 130 may be configured to store measurements and instructions. The transmitter 136 of the controller 130 may be configured to send instructions to the FOUP 102, the process stage 120, or other locations.

The FOUP 102 may be placed in the process stage 120 during a processing operation for the wafers within the FOUP. In some embodiments the process stage 120 may be configured to receive instructions from the controller 130. For example, if the controller 130 determines that the one or more environmental parameters of the FOUP 102 are not within acceptable limits, the controller 130 may transmit directions to the FOUP 102 and/or the process stage 120 to remove the FOUP 102 from processing. The process stage 120 may also include a processor and/or a receiver.

Figure 2:
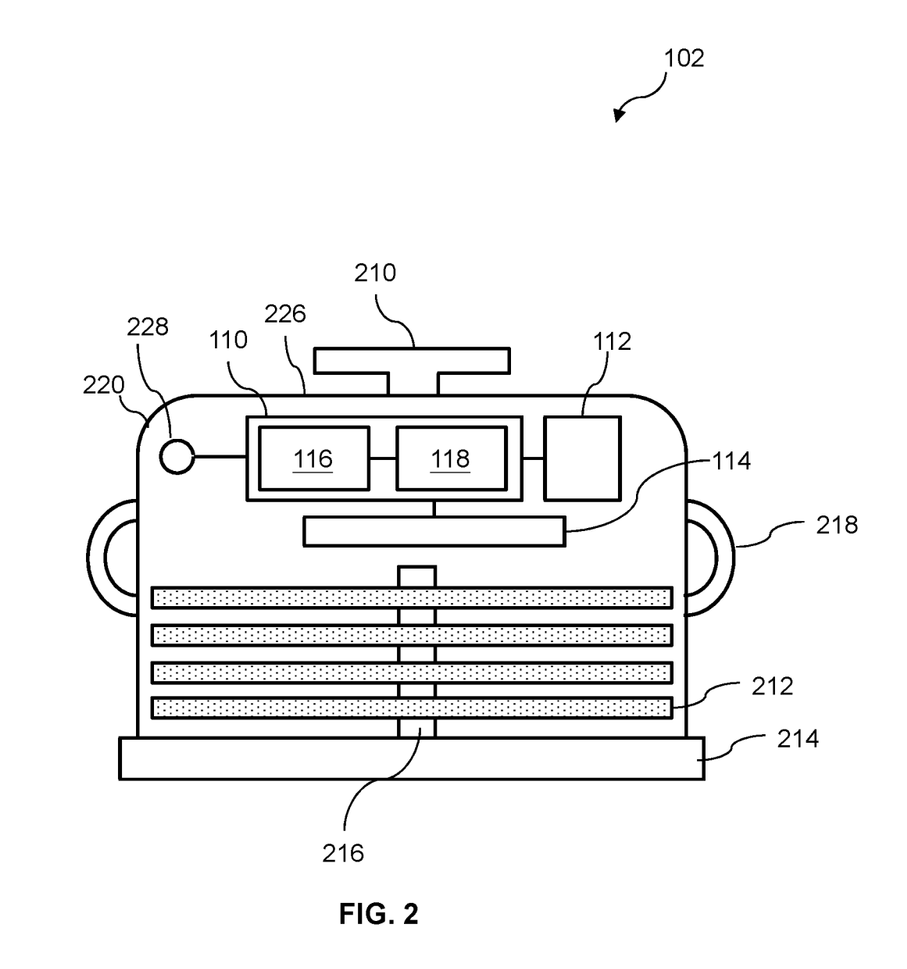
FIG. 2 is a diagram of a FOUP with one or more environmental sensors in accordance with aspects of the present disclosure.

FIG. 2 is a diagram of a FOUP 102 with one or more environmental sensors 110. In some embodiments, the FOUP 102 includes an enclosure 220 configured to hold one or more wafers 212 in a protected environment. The wafers 212 may be carried on a retaining feature 216. The retaining feature 216 may be a rack, bracket, shelf, clip, framework, or other feature to secure the wafers 212 during transport and handling. The enclosure 220 may have a generally rectangular shape with a body including three connected walls, a door 222 (shown in FIG. 3), a top 226, and a base 214. In some embodiments, the enclosure 220 has curved upper corners. The enclosure 220 may be made of a rigid material to protect and securely hold the wafers inside. In some embodiments, the enclosure is formed from plastic materials. In some embodiments, a flange 210 is disposed on a top surface of the top 226 of the FOUP 102. One or more handles 218 may be disposed on sides of the enclosure 220. In some embodiments, the flange 210 and handles 218 may be used to handle and transport the FOUP 102.

The FOUP 102 may be configured to support a controlled environment. Aspects or parameters of this controlled environment may include, for example, humidity, temperature, vibration, incident radiation, particle density, and chemical composition. The controlled environment may be created by one or more environmental support devices 112 in the FOUP 102. These environmental support devices 112 may include vents and purging systems (which may be disposed on the walls, base 214, top 226, and door 222 of the FOUP 102), mechanical structures such as anti-radiation plating and coatings, anti-vibration systems, gaskets, flanges, and other sealing features (which may be disposed in the walls, door 222, and base 214 of the FOUP 102), gas systems such as humidity control devices, input/output valves, and electronics to support the environmental support devices 112. For example, the FOUP 102 may include a primarily nitrogen gas environment which may help to avoid native oxide growth on the wafers as well as organic contaminants. In some embodiments, the FOUP 102 is configured to maintain a particle free nitrogen environment with a constant temperature, humidity, and minimal incident radiation and vibration. In some embodiments, the one or more environmental sensors 110 are connected to the one or more environmental support devices 112.

One or more environmental sensors 110 may be placed on or within the FOUP to assist in maintain the environment of the FOUP 102. The one or more environmental sensors 110 may be disposed within an interior volume of the FOUP 102 and may measure the environmental parameters of the FOUP 102 including humidity, temperature, vibration, incident radiation, particle density, and chemical composition. The environmental sensors 110 may include one or more humidity sensors, thermometers, accelerometers, radiation detectors, particle detectors, and chemical detection systems. In some embodiments, two or more environmental sensors 110 of the same type may be included in the FOUP 102. For example, the FOUP 102 may include two temperature sensors and/or two vibration sensors. The inclusion of more than one sensor of each type may help to verify readings and provide a level of security in case one of the sensors fails. In some embodiments, the environmental sensors 110 are disposed on a door 222 of the FOUP 102 as shown in FIG. 3. In other embodiments, the environmental sensors 110 are disposed on other portions of the FOUP 102, such as on the walls, base 214, or top 226. The one or more environmental sensors 110 may be configured to take measurements of the environment within the FOUP 102 in real time, including during handling and transportation. This may provide an early warning for FOUP control systems and may help to remedy problems before wafers 212 are harmed. In some embodiments, the one or more environmental sensors 110 include sensors of two or more types. For example, the FOUP 102 may include a vibration sensor integrated into a first portion of the door 222 of the FOUP 102 and a humidity sensor integrated into a second portion of the door 222 of the FOUP 102. In some embodiments, the one or more environmental sensors 110 are configured to take measurements of the FOUP environment between every process stage 120. In other embodiments, the one or more environmental sensors 110 are activated during and after particular process stages, such as after a lithographic stage. The one or more environmental sensors 110 may be activated automatically 110 by the controller 130 or other computer system, or manually by an operator. In some embodiments, the one or more environmental sensors 110 are configured to be activated by a port or switch on an external surface of the FOUP 102, such that the environmental sensors 110 may be activated by a person or machine handling the FOUP 102.

The one or more environmental sensors 110 may be configured to control the environmental support devices 112 to control the environment within the FOUP 102. This may include adjusting the pressure, humidity, temperature, and/or chemical composition of the FOUP 102. For example, the one or more environmental sensors 110 may identify the presence of contaminants in the nitrogen gas within the FOUP 102. In response, a purging system may automatically activate within the FOUP 102 to flush out the contaminants. This may allow the FOUP 102 to correct some environmental problems automatically while the FOUP is on the production line and without requiring the FOUP 102 to be moved offline. Additionally, automatic systems within the FOUP 102 may allow problems to be remedies quickly to avoid damage to wafers.

The one or more environmental sensors 110 may include a processor 116 and a memory 118. For example, the processor 116 of the environmental sensors 110 may include any one or more of a microprocessor, a controller, a digital signal processor (DSP), an application specific integrated circuit (ASIC), a field-programmable gate array (FPGA), or equivalent discrete or integrated logic circuitry. The processor 116 may be connected to the memory 118 as well as a transmitter 114. In some embodiments, the processor 116 may be configured to receive measurements from the one or more environmental sensors 110 and transmit the measurements via the transmitter 114. The memory 118 of the environmental sensors 110 may be a semiconductor memory such as, for example, read-only memory, a random access memory, a FRAM, or a NAND flash memory. The memory 118 may interface with the processor 116 such that the processor 116 may write to and read from the memory 118. The one or more environmental sensors 110 may be powered through a power source disposed within the FOUP 102. For example, the one or more environmental sensors 110 may be powered by one or more batteries stored within the FOUP.

Figure 4:
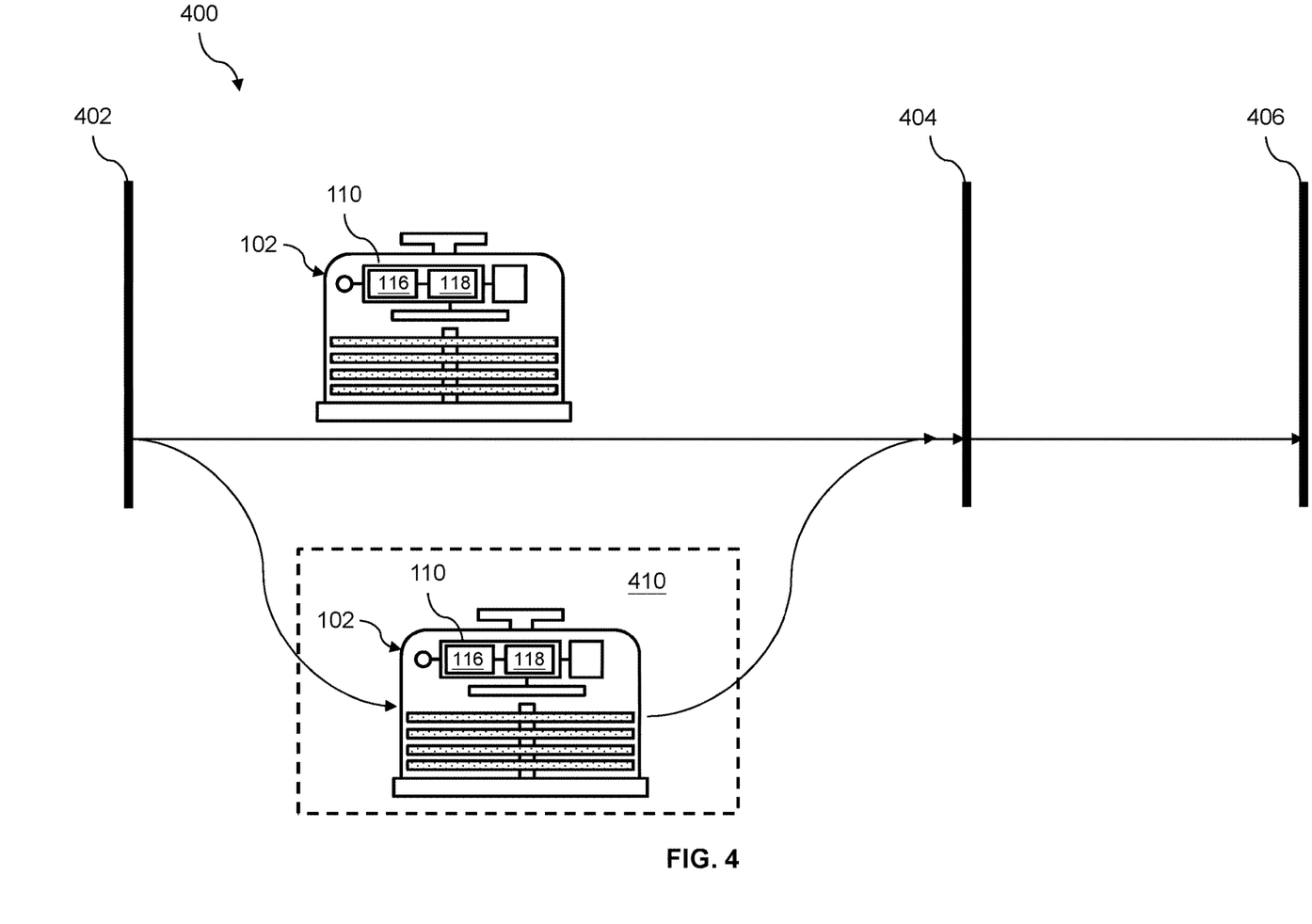
FIG. 4 is a diagram of a process of monitoring a FOUP in accordance with aspects of the present disclosure.

These batteries may be recharged at environmental remedy stations, such as environmental remedy station 410 as shown in FIG. 4.

The transmitter 114 may be configured to receive measurements from the one or more environmental sensors 110 and transmit the measurements to the controller 130, a process stage 120, and/or other locations. In some embodiments, the transmitter 114 is a wireless transmitter. The transmitter 114 may be disposed inside the FOUP 102, such as attached a door 222 of the FOUP 102. In some embodiments, the transmitter 114 is positioned together with the one or more environmental sensors 110 within a housing. The transmitter 114 may also be integrated into the door 222 of the FOUP 102 with the one or more environmental sensors 110. The transmitter 114 may be electrically connected with the one or more environmental sensors 110.

FIG. 3 is a diagram showing a side view of the FOUP 102. In some embodiments, the FOUP 102 includes a door 222 that is configured to connect to the enclosure 220 of the FOUP 102. The door 222 may be removable. The one or more environmental sensors 110 may be disposed on an interior surface of the door 222. In some embodiments, the transmitter 114 is also disposed on the interior surface of the door 222. The one or more environmental sensors 110 and/or transmitter 114 may be disposed within a housing 224 on the door to protect the environmental sensors 110 and/or transmitter from being damaged during loading and unloading the FOUP 102. In some embodiments, the housing 224 is removable so that an operator can access the environmental sensors 110 and/or transmitter 114. In some embodiments, the one or more environmental sensors 110 are integrated into the door 222 of the FOUP 102, such that portions of the door 222 extend around the one or more environmental sensors 110. In other embodiments, the one or more environmental sensors 110 are disposed in a housing that is attached to the door 222. This housing may conform to the shape of the one or more environmental sensors 110. The housing may help to protect the one or more environmental sensors from being damaged during processing.

FIG. 4 is a diagram 400 showing a process of monitoring a FOUP 102. As discussed above, the FOUP 102 may include one or more environmental sensors 110 which may perform measurements of the internal environment of the FOUP 102. In some embodiments, the one or more environmental sensors 110 are configured to measure the environment of the FOUP 102 in real time and transmit these measurements in real time to the controller 130. A number of process stages 402, 404, 406 are also shown on in the diagram 400. The one or more environmental sensors 110 may be configured to measure the environment of the FOUP 102 between stages 402 and 404 and between stages 404 and 406. In some embodiments, the one or more environmental sensors 110 are configured to measure the environmental parameters of the FOUP 102 before and/or after a particular process stage 402, 404, 406.

In some embodiments, the controller 130 is configured to receive the measurements of the one or more environmental sensors 110 and determine if the measurements are within acceptable ranges. If the controller 130 determines that the measurements are within acceptable ranges, the FOUP 102 is allowed to continue to the next stage 404, 406. If the controller 130 determines that the measurements are outside acceptable ranges, the controller 130 may issue a prompt or alert to an operator and the FOUP 102 may be removed from the process stages 402, 404, 406 and moved offline. This may involve physically removing the FOUP 102 from the processing stage 402, 404, 406 and/or taking the FOUP 102 to an environment remedy area 410. In the environment remedy area 410, any deficiencies in the environment of the FOUP 102 (such as those identified by the one or more environmental sensors 110) may be remedied. This may involve removing dust or other particulates, purging the FOUP 102, renewing the gas within the FOUP 102 (such as recharging nitrogen levels), changing the humidity of the FOUP 102, changing the temperature of the FOUP 102, as well as taking other steps to remedy problems with the environment of the FOUP 102. Once the remedies are complete, the environmental parameters of the FOUP 102 may be rechecked by the one or more environmental sensors 110 to ensure that the problem has been remedied. After the environment of the FOUP 102 is determined to be within acceptable levels, the FOUP 102 may be returned to the processing stages 402, 404, 406. In some embodiments, the FOUP 102 may be returned to its location before the environmental problem was detected. For example, the one or more environmental sensors 110 within a FOUP 102 may measure an abnormally high temperature shortly before the FOUP 102 is scheduled for process stage 404. After the FOUP 102 is pulled offline and the problem is remedied, the FOUP 102 may be returned to process stage 404. In some embodiments, if damage to the wafers in the FOUP 102 is detected, the wafers of the FOUP 102 may be discarded and the FOUP 102 may be returned to the beginning of the operation to hold a new set of wafers.

Figure 5:
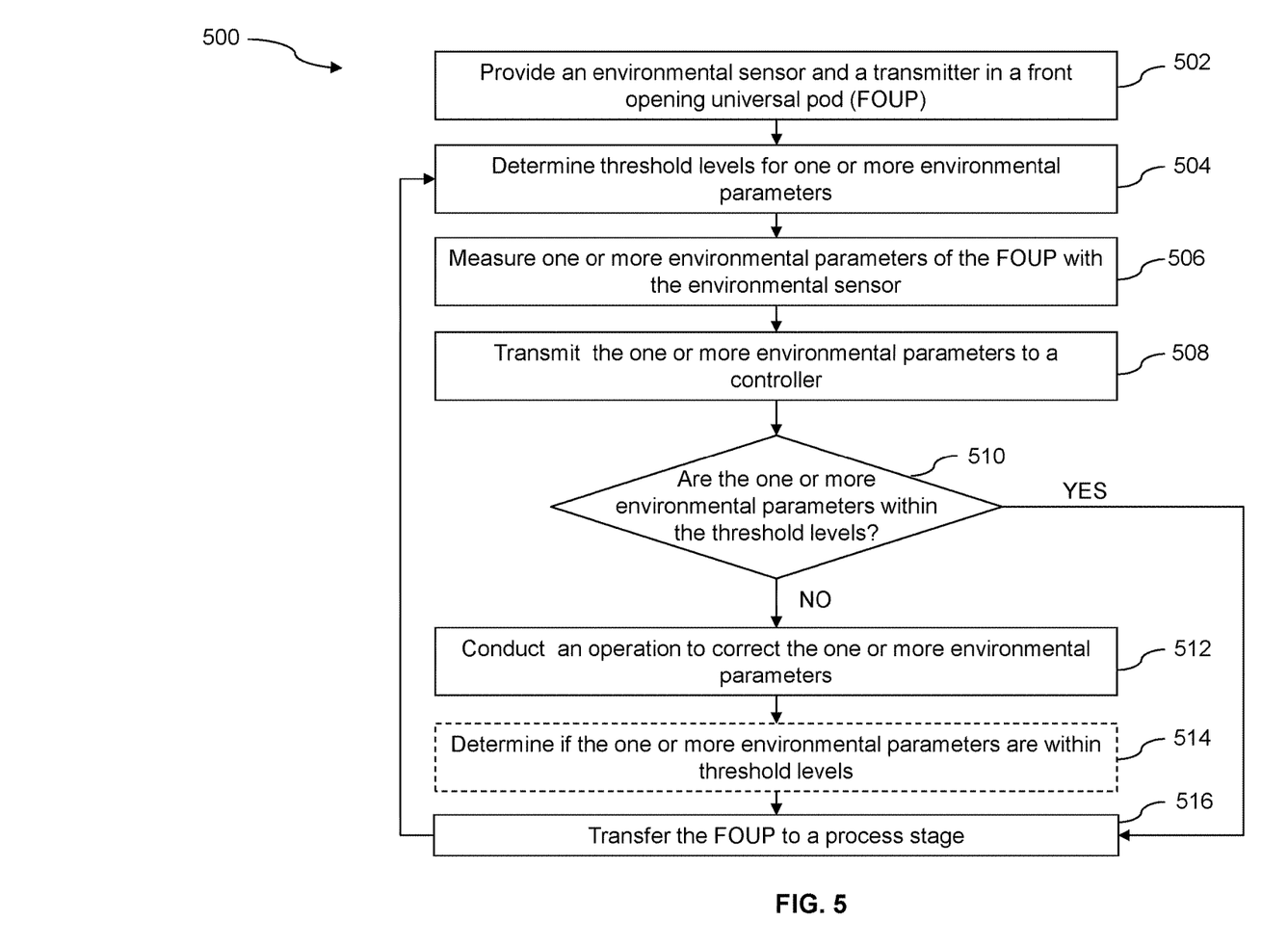
FIG. 5 is a flow diagram of a method for monitoring a FOUP in accordance with aspects of the present disclosure.

FIG. 5 is a flow diagram of a method 500 for monitoring a FOUP in accordance with aspects of the present disclosure. It is understood that additional steps can be provided before, during, and after the steps of method 500, and that some of the steps described can be replaced or eliminated for other implementations of the method 500.

In one embodiment, the method 500 begins at step 502 with providing an environmental sensor and a transmitter in a front opening universal pod (FOUP). The environmental sensor, transmitter, and FOUP may be the environmental sensor 110, transmitter 114, and FOUP 102 as shown in any of FIGS. 1-4. The environmental sensor and transmitter may be disposed within the FOUP, such as on the door of the FOUP. The environmental sensor may be configured to measure environmental parameters of the FOUP, such as humidity, temperature, vibration, incident radiation, particle density, and chemical composition. The transmitter may be configured to transmit the measured environmental parameters to a controller, such as controller 130 as shown in FIG. 1.

At step 504, the method 500 may include determining threshold levels for the one or more environmental parameters. In some embodiments, the threshold levels may represent limits above which wafers within the FOUP may be damaged. For example, threshold levels for pressure may be 1.2 atm or 0.8 atm (with an ideal pressure of 1 atm). Another example is a threshold level of 5% or 65% relative humidity (with an ideal relative humidity of 40%). The threshold levels may be determined by or communicated to a controller within the FOUP and may be stored in a memory within the FOUP or in an external controller.

At step 506, the method 500 may include measuring one or more environmental parameters with the environmental sensor. The environmental sensor may include humidity sensors, thermometers, accelerometers, radiation detectors, particle detectors, and chemical detection systems. In some embodiments, the environmental sensor is used to measure the environmental parameters is real time. Alternatively, the environmental sensor may measure the environmental parameters at certain times during transportation, handling, and processing of the FOUP, such as between processing stages. The measurements may be stored in memory within the FOUP.

At step 508, the method 500 may include transmitting the one or more environmental parameters to a controller. In some embodiments, the transmission is wireless and is accomplished with a wireless transmitter. The controller may include a wireless receiver and may store the received measurements.

At step 510, the method 500 may include determining whether the one or more environmental parameters are within the threshold levels determined in step 504. This may include comparing, with the controller, the measured environmental parameters to the threshold levels. Step 510 may also include displaying the determination, such as with a graphic or alert, on a display device. This display device may be similar to the display device 140 as shown in FIG. 1. Additionally and alternatively, a display feature may be included on the FOUP to display this determination. This display feature may be similar to the indicator 228 as shown in FIGS. 2 and 3. If the controller determines that the one or more measured environmental parameters are within the threshold levels, the FOUP may be transferred to a process stage at step 516. The FOUP may also be configured to display a message, graphic, or other indicia of the determination (such as a green light). If the controller determines that the one or more measured environmental parameters are not within the threshold levels, the method 500 may proceed to step 512. The FOUP may also be configured to display a message, graphic, or other indicia of the determination (such as a red light). An alert may also be transmitted to a process stage. This alert may be displayed on a display device located nearby or disposed on the process stage. For example, a controller may determine that a FOUP has an environmental problem based on readings from the one or more environmental sensors within the FOUP. As the FOUP is transported to the process stage for processing, the process stage may display an indication of a problem with the particular FOUP. This may help an operator to identify problems with the FOUP before processing and may help to remedy the environment as soon as possible to avoid damage to wafers in the FOUP.

At step 512, the method 500 may include conducting an operation to correct the one or more environmental parameters. This may include taking the FOUP offline and to a particular area for addressing the FOUP environment. In some embodiments, this step 512 includes recharging nitrogen (or other gases) within the FOUP, flushing out gases from the FOUP, removing particles, reducing or increasing humidity or temperature levels, and/or replacing mechanisms on the FOUP such as faulty seals.

At step 514, the method 500 may optionally include determining if the one or more environmental parameters are within the threshold levels after conducting the operation of step 512. This may help to ensure that all problems are fixed and the FOUP is ready for further transportation and handling.

At step 516, the method 500 may include transferring the FOUP to a process stage. This process stage may be any of the process stages 120, 402, 404, 406 as shown in FIGS. 1 and 4.

In an exemplary implementation within the scope of the present disclosure, the method 500 repeats after step 516, such that method flow goes back to step 504 and begins again. Iteration of the method 500 may be utilized to carry out ongoing monitoring of the environment within a FOUP.

Thus, the present disclosure provides a system for monitoring a front opening universal pod (FOUP). In one embodiment, the system comprises a FOUP configured to hold one or more wafers. The system also comprises an environmental sensor disposed within the FOUP and configured to measure one or more environmental parameters of an interior environment of the FOUP, and a wireless transmitter disposed within the FOUP and in communication with the environmental sensor, wherein the wireless transmitter is configured to wirelessly transmit the one or more environmental parameters from the environmental sensor to a controller disposed outside of the FOUP to decide whether the one or more environmental parameters are within threshold limits and receive a message according to a decision of whether the one or more environmental parameters are within the threshold limits from the controller.

In some embodiments, the system further comprises an indicator disposed in the FOUP and displaying an indication of the interior environment of the FOUP according to the message. In some further embodiments, the indicator is an LED light configured to display an alert if the one or more environmental parameters exceed the threshold limits. In some other embodiment, the indicator is a screen configured to display the one or more environmental parameters.

In some embodiments, the wireless transmitter is disposed on a door of the FOUP. In some embodiments, the environmental sensor is disposed on a door of the FOUP.

In some embodiments, the system further comprises an environmental support device disposed in the FOUP and configured to change the interior environment of the FOUP if the one or more environmental parameters exceed the threshold limits.

The present disclosure also provides an exemplary FOUP configured to hold one or more wafers. The exemplary FOUP comprises an environmental sensor configured to measure one or more environmental parameters of an interior environment of the FOUP; a wireless transmitter in communication with the environmental sensor, wherein the wireless transmitter is configured to wirelessly transmit the one or more environmental parameters from the environmental sensor to a controller and receive a message from the controller according to a decision of whether the one or more environmental parameters are within threshold limits; and an environmental support device configured to change the interior environment of the FOUP if the one or more environmental parameters exceed the threshold limits. In some embodiments, the environmental support device includes at least one of a purging system, an anti-radiation system, an anti-vibration system, a sealing system, a humidity control system, and an input/output valve. In some embodiments, the FOUP further comprises an indicator displaying an indication of the interior environment of the FOUP. In some embodiments, the FOUP further comprises a memory configured to store the one or more environmental parameters of the interior environment of the FOUP.

In some embodiments, the environmental sensor is operable to be activated automatically before or after a process stage. In some embodiments, the environmental sensor includes more than one sensors for measuring a same type of environmental parameter.

The present disclosure also provides a method for monitoring an environment within a front opening universal pod (FOUP). The method comprises measuring one or more environmental parameters of the FOUP by an environmental sensor disposed within the FOUP; transmitting, with a wireless transmitter disposed within the FOUP, the one or more environmental parameters of the FOUP to a controller outside of the FOUP; receiving, by the wireless transmitter from the controller, a message according to a decision of whether the one or more environmental parameters of the FOUP are within the threshold levels; and performing, by an environmental support device in the FOUP, an operation to change the environment within the FOUP if the one or more environmental parameters exceed the threshold levels.

In some embodiments, the operation to change the environment within the FOUP includes at least one of purging, sealing, renewing gas, reducing radiation, reducing vibration, changing humidity, and changing temperature of the FOUP. In some embodiments, the one or more environmental parameters are measured in real time by the environmental sensor. In some embodiments, measuring the one or more environmental parameters includes automatically activating the environmental sensor before or after a process stage to measure the one or more environmental parameters of the FOUP.

In some embodiments, the method further comprises indicating the one or more environmental parameters on a door of the FOUP. In some embodiments, the method further comprises indicating an alert if the one or more environmental parameters are determined to not be within the threshold levels. In some embodiments, the method further comprises storing the one or more environmental parameters in a memory disposed in the FOUP.

Features of several embodiments have been outlined above. Those skilled in the art will appreciate that they may readily use the present disclosure as a basis for designing or modifying other processes and structures for carrying out the same purposes and/or achieving the same advantages as the embodiments introduced above. Those skilled in the art will also realize that such equivalent constructions do not depart from the spirit and scope of the present disclosure, and that they may make various changes, substitutions and alterations to the disclosed embodiments without departing from the spirit and scope of the present disclosure.

What is claimed is:

1. A system, comprising:
    a front opening universal pod (FOUP), configured to hold one or more wafers;
    an environmental sensor disposed within the FOUP and configured to measure one or more environmental parameters of an interior environment of the FOUP, wherein the environmental sensor is disposed on a door of the FOUP; and
    a wireless transmitter disposed within the FOUP and in communication with the environmental sensor, wherein the wireless transmitter is configured to wirelessly transmit the one or more environmental parameters from the environmental sensor to a controller to decide whether the one or more environmental parameters are within threshold limits and receive a message according to a decision of whether the one or more environmental parameters are within the threshold limits from the controller.

2. The system of claim 1, further comprising an indicator disposed in the FOUP and displaying an indication of the interior environment of the FOUP according to the message.

3. The system of claim 2, wherein the indicator is an LED light configured to display an alert if the one or more environmental parameters exceed the threshold limits.

4. The system of claim 2, wherein the indicator is a screen configured to display the one or more environmental parameters.

5. The system of claim 1, wherein the wireless transmitter is disposed on a door of the FOUP.

6. The system of claim 1, further comprising an environmental support device disposed in the FOUP and configured to change the interior environment of the FOUP if the one or more environmental parameters exceed the threshold limits.

7. The system of claim 1, wherein the environmental sensors is selected from the group consisting of a humidity sensor, a thermometer, accelerometer, a radiation detector, a particle detector and a chemical detector.

8. A front opening universal pod (FOUP), configured to hold one or more wafers, comprising:
    an environmental sensor configured to measure one or more environmental parameters of an interior environment of the FOUP, wherein the environmental sensor is disposed on a door of the FOUP;
    a wireless transmitter in communication with the environmental sensor, wherein the wireless transmitter is configured to wirelessly transmit the one or more environmental parameters from the environmental sensor to a controller and receive a message from the controller according to a decision of whether the one or more environmental parameters are within threshold limits; and
    an environmental support device configured to change the interior environment of the FOUP if the one or more environmental parameters exceed the threshold limits.

9. The FOUP of claim 8, wherein the environmental support device includes at least one of a purging system, an anti-radiation system, an anti-vibration system, a sealing system, a humidity control system, and an input/output valve.

10. The FOUP of claim 9, further comprising an indicator displaying an indication of the interior environment of the FOUP.

11. The FOUP of claim 8, wherein the environmental sensor is operable to be activated automatically before or after a process stage.

12. The FOUP of claim 8, wherein the environmental sensor includes more than one sensors for measuring a same type of environmental parameter.

13. The FOUP of claim 8, further comprising a memory configured to store the one or more environmental parameters of the interior environment of the FOUP.

14. The FOUP of claim 8, wherein the wireless transmitter is disposed on a door of the FOUP.

15. A method for monitoring an environment within a front opening universal pod (FOUP), comprising:
    measuring one or more environmental parameters of the FOUP by an environmental sensor disposed within the FOUP;
    transmitting, with a wireless transmitter disposed within the FOUP, the one or more environmental parameters of the FOUP to a controller outside of the FOUP;
    receiving, by the wireless transmitter from the controller, a message according to a decision of whether the one or more environmental parameters of the FOUP are within the threshold levels;
    performing, by an environmental support device in the FOUP, an operation to change the environment within the FOUP if the one or more environmental parameters exceed the threshold levels; and
    indicating the one or more environmental parameters on a door of the FOUP.

16. The method of claim 15, wherein the operation to change the environment within the FOUP includes at least one of purging, sealing, renewing gas, reducing radiation, reducing vibration, changing humidity, and changing temperature of the FOUP.

17. The method of claim 15, wherein the one or more environmental parameters are measured in real time by the environmental sensor.

18. The method of claim 15, wherein measuring the one or more environmental parameters includes automatically activating the environmental sensor before or after a process stage to measure the one or more environmental parameters of the FOUP.

19. The method of claim 15, further comprising:
    indicating an alert if the one or more environmental parameters are determined to not be within the threshold levels.

20. The method of claim 15, further comprising:
    storing the one or more environmental parameters in a memory disposed in the FOUP.

* * * * *